United States Patent [19]
Jang

[11] Patent Number: 5,920,519
[45] Date of Patent: Jul. 6, 1999

[54] SEMICONDUCTOR MEMORY WITH SENSING STABILITY

[75] Inventor: Cheol-Ung Jang, Kyunggi Province, Rep. of Korea

[73] Assignee: Samsung Electronics Co., Ltd., Suwon, Rep. of Korea

[21] Appl. No.: 08/855,256

[22] Filed: May 13, 1997

[30] Foreign Application Priority Data

May 13, 1996 [KR] Rep. of Korea ...................... 96-15842

[51] Int. Cl.$^6$ ....................................................... G11C 8/00
[52] U.S. Cl. ................................... 365/233.5; 365/238.5; 365/230.06
[58] Field of Search ............................ 365/233.5, 238.5, 365/230.06, 203, 205

[56] References Cited

U.S. PATENT DOCUMENTS 5,404,327  4/1995  Houston ................................. 365/203
5,592,426  1/1997  Jallice et al. ...................... 365/233.5 X
5,636,177  6/1997  Fu ........................................ 365/233.5
5,694,370  12/1997  Yoon .................................... 365/238.5

*Primary Examiner*—Huan Hoang
*Attorney, Agent, or Firm*—Jones & Volentine, L.L.P.

[57] ABSTRACT

A memory having a read function for generating a plurality of data bits on a single output pin includes a control circuit, a sense amplifier circuit, and a decoder. The control circuit generates a decoder control pulse responding to the control pulse generated from an address transition detector receiving a first address. The sense amplifier circuit senses data bits from a memory array of the memory and is coupled to the output pin through a data output buffer. The decoder receives a second address and provides decoding signals to the sense amplifier circuitry in response to the control pulse generated from the control circuit. The read-out operation according to the invention is performed sufficiently and stably even when a propagation skew occurs between the first address and the second address.

3 Claims, 9 Drawing Sheets

SEMICONDUCTOR MEMORY WITH SENSING STABILITY

BACKGROUND OF THE INVENTION

The present invention relates to semiconductor memories. More specifically, the present invention relates to semiconductor memories employing a page read-out mode and an address transition detecting function.

In semiconductor memory devices an advanced function has been recently proposed. In this function, a read operation progresses in a page mode, in which (m×n) data bits are read in, amplified, and then stored in an (m×n) sense amplifier. These data bits are then sequentially read out n times through m input/output pins. The unit of a page, for example, can be regarded to as data capacity engaged in memory cells which are connected to a word line and to plural bit lines.

This kind of a read operation using a page mode offers an enhanced read-out speed higher than in any other conventional reading process. It provides multiple data bits per single word line to output terminals throughout multiple succeeding times without delaying for read operation to read the next data bits.

FIG. 1 shows the construction of a conventional semiconductor memory employing a page read operation, where data bits of four times of the number of input/output pins are simultaneously amplified and stored in latch circuits.

As shown FIG. 1, elements of the semiconductor memory used for a basic reading function are involved in connection with themselves, such as memory cell array 10, column gate circuit 12, sense amplifier circuitry 14, pre-decoder 22, row decoder 24, column decoder 26, page decoder 28, address transition detector 30, data output buffer 32 and input/output pads 34. The normal address 16 is applied to address transition detector 30 and predecoder 22; the page address 18 is applied to page decoder 28; and the output enable signal 20 is applied to the data output buffer 32.

FIGS. 2 through 4 show the address transition detector 30, the page decoder 28, and the sense amplifier circuitry 14, respectively.

The read operation in the memory of FIG. 1 can be understood with reference to the timing diagrams of FIGS. 5 and 6, and the circuit diagrams of FIGS. 1 through 4. The timing diagram of FIG. 5 describes a normal read operation, while FIG. 6 shows an abnormal read operation as will be mentioned later.

In FIG. 5, once normal address signals $A_2$ through $A_i$ are applied to the memory, in the address transition detector 30 of FIG. 2, short pulse signals $Sp_i$ (including their complementary signals $\overline{Sp_i}$) and a sum pulse signal SUM are generated through short pulse generators 116 through 120 and a summing amplifier (or summator) 122, respectively. Thereafter, a precharge control pulse PRE is generated from precharge controller 124, based on the sum pulse signal SUM. The short pulse signals are activated at a high level and are merged to form a low sum pulse. When the precharge control pulse PRE is low, it sets corresponding bit lines (e.g., four bit lines for the page read-out) at a predetermined precharge voltage.

When the precharge control pulse PRE rises up to high level from the low level, sense amplifiers 142 through 148 in sense amplifier circuitry 14 of FIG. 4 are conducted to detect data bits loaded on the four bit lines. Output signals from the sense amplifiers 142 to 148 are stored in data latches 150 through 156. Transmission circuits 158 through 164 are respectively controlled by the outputs $SS_0$ to $SS_3$ from the page decoder 28 shown in FIG. 3. The output signals from page decoder 28, namely page decoding signals $SS_0$ through $SS_3$, are generated through NAND gates 126 to 132 and inverters 134 through 140 in response to the page address signals $A_0$ and $A_1$ (including their complementary signals $\overline{A_0}$ and $\overline{A_1}$). Any one of the page decoding signals does not activate until the page address signals has been operably varied for it. At that time, one of transmission circuits 158 to 164 is enabled because of an activation of a page decoding signal, which responds at least to the page address signals. Thus a data bit held in one of data latches 150 to 156 is transferred to data the output buffer 32 through the corresponding transmission circuit which is enabled by a high leveled page decoding signal. The required output data bit is generated from the data output buffer 32 at time $t_1$. After this, data bits are generated from $t_2$ in accordance with subsequent transitions of the page address signals and page decoding signals. As a result, four bits are generated for a single data output buffer corresponding to a single data input/output pin in a normal page read-out operation.

However, an abnormal timing situation, as shown in FIG. 6, results from a difference of propagation timings between the normal address and the page address. The difference of propagation timings may be referred to in general as a skew that is due to malfunctions of control circuits involved in transferring the addresses.

FIG. 6 shows a page address signal that is early and varies a page decoding signal $SS_i$ (i is one of 0 to 3), at time $t_S$. This turns on the transmission circuit of FIG. 4 and makes the time $t_S$ becomes the point when the precharge control pulse PRE goes to high from low, thus causing sensing operations upon the bit lines to start at that point.

Because of this unwanted activation of the transmission circuit in response to the enabled page decoding signal, an invalid data bit is generated through the data output buffer. Furthermore, referring to FIG. 4, since ground bouncing noise may be induced at an input terminal of the data output buffer 32 when page decoding signal $SS_i$ is high and nodes 166 and 168 remain high, any one of the sensed signals from the sense amplifiers would be deteriorated and affected in a fluctuation thereby. Such abnormal operation arises from the fact that a transmission circuit as shown in FIG. 4 becomes conductive before valid data bits corresponding to one page (e.g., four bits per page) has been generated from sense amplifiers.

SUMMARY OF THE INVENTION

Accordingly, it is a primary object of the invention to provide a memory employing a page read-out function with being secured of a stable sensing operation, It is another object of the invention to provide a memory employing a page read-out function with an abnormal propagation difference between a normal address and a page address.

In order to accomplish those objects, a memory of this invention has a read function for generating a plurality of data bits per an output pin, including; an address transition detector for generating a control pulse responding to a transition of a first address; a control circuit for generating a decoder control pulse responding to the control pulse generated from the address transition detector; a sense amplifier circuitry for sensing data bits from a memory array of the memory, the circuitry having data latches and transmission circuits and being coupled to the output pin through a data output buffer; and a decoder for receiving a second address and for providing decoding signals to the sense amplifier circuitry in response to the control pulse generated from the control circuit. Each of the number of the sense amplifiers, the data latches and transmission circuits is equal to that of the data bits, and the number of the decoding signals being equal to that of the data bits.

DETAILED DESCRIPTION OF THE PREFERRED EMBODIMENTS

Figure 1:
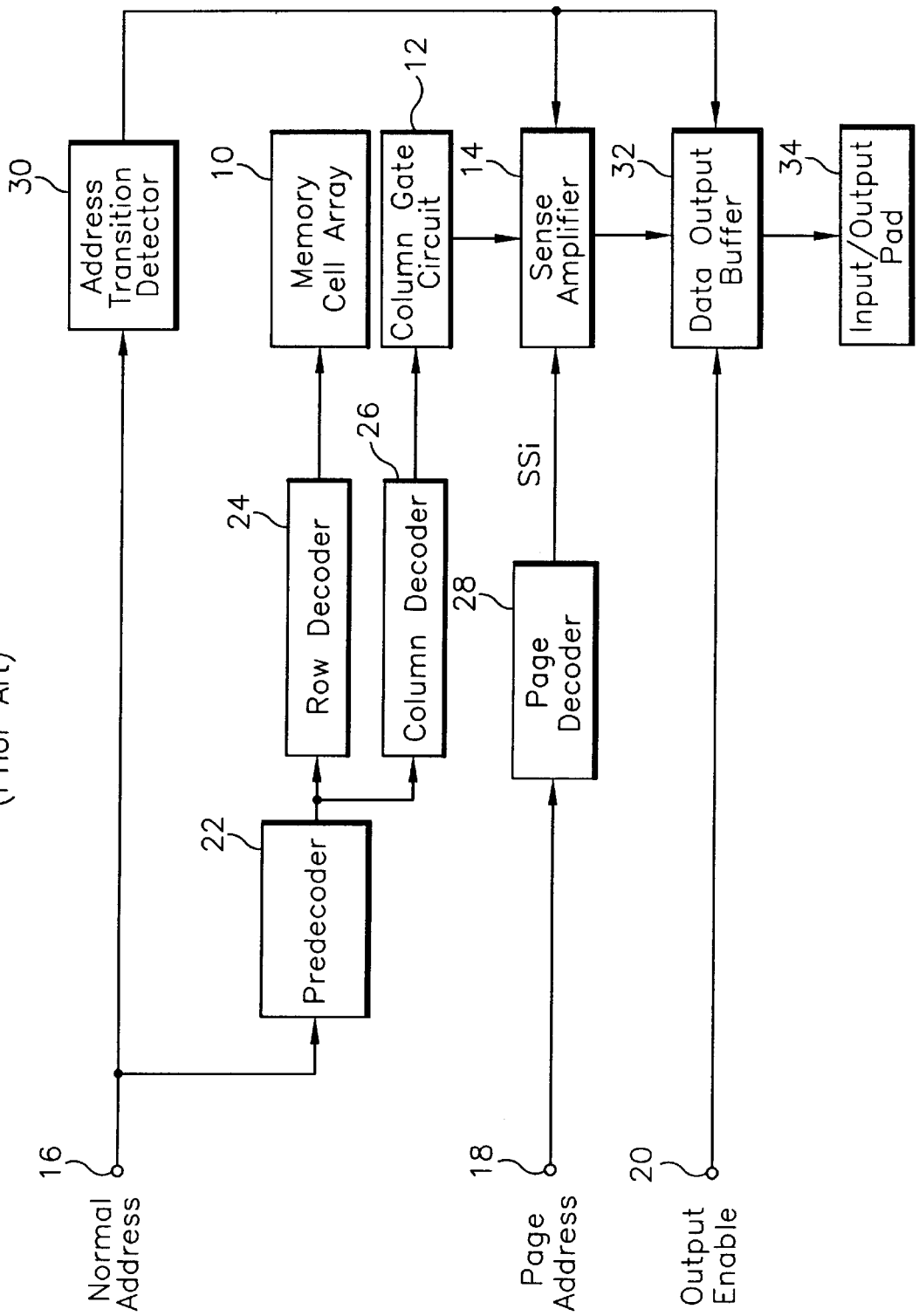
FIG. 1 is a diagram illustrating a functional structure for sensing data in a conventional semiconductor memory.

Preferred embodiments of the present invention will be described below, with reference to the appended drawings. In these drawings, like reference characters designate like or corresponding parts throughout the several views.

Figure 7:
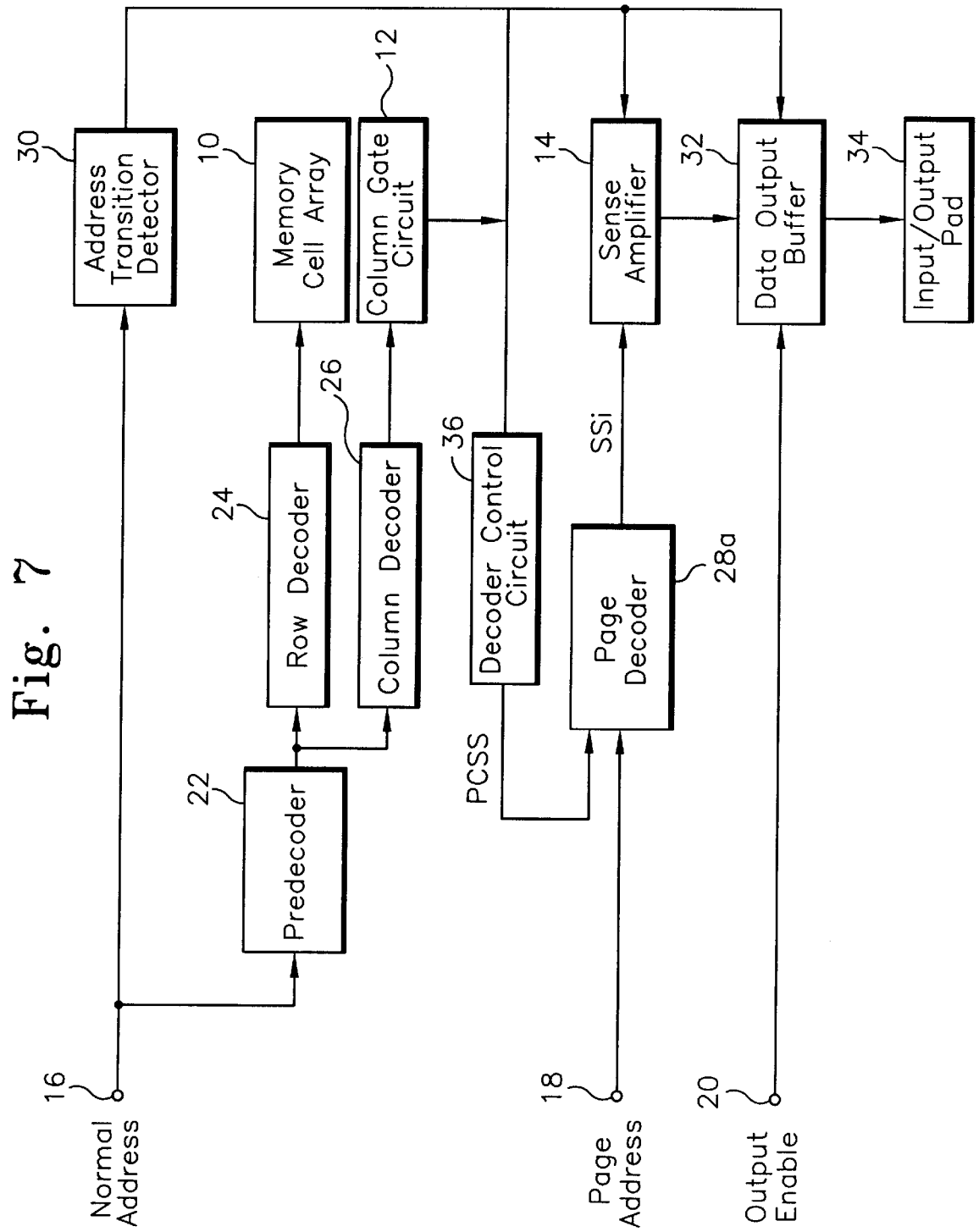
FIG. 7 is a schematic view illustrating a functional construction of a memory according to a preferred embodiment of the present invention.

FIG. 7 is a schematic view illustrating a functional construction of a semiconductor memory according to a preferred embodiment of the present invention. As shown in FIG. 7, the semiconductor memory of the present invention includes a page decoder control circuit 36, in addition to the structural combination of FIG. 1.

The decoder control circuit 36 provides a page decoder control pulse PCSS to the page decoder 28a in response to the precharge control pulse PRE. The precharge control pulse PRE, generated from the address transition detector 30, is also connected to the sense amplifier circuitry 14 and the data output buffer 32. The page decoder 28a composes page decoding signals $SS_i$ (i=0 through 3 in this embodiment) of the number of data bits per a page from page address signals.

Figure 2:
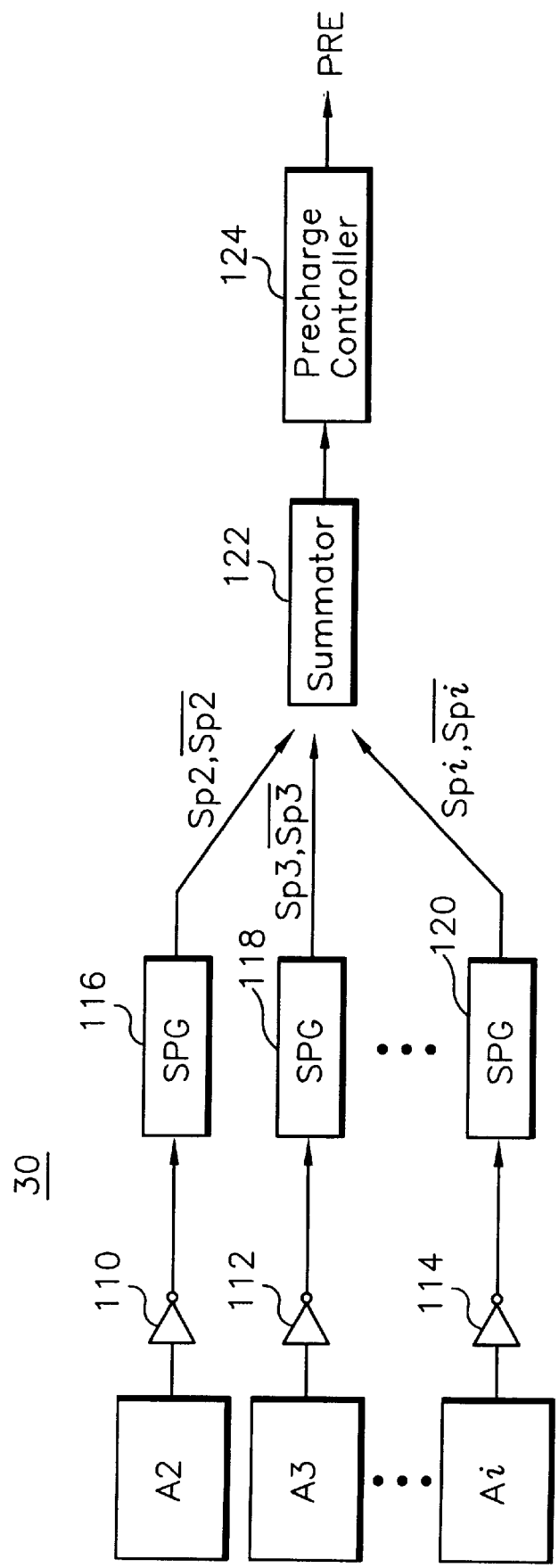
FIG. 2 is a diagram illustrating a construction of the address transition detector shown in FIG. 1.
Figure 3:
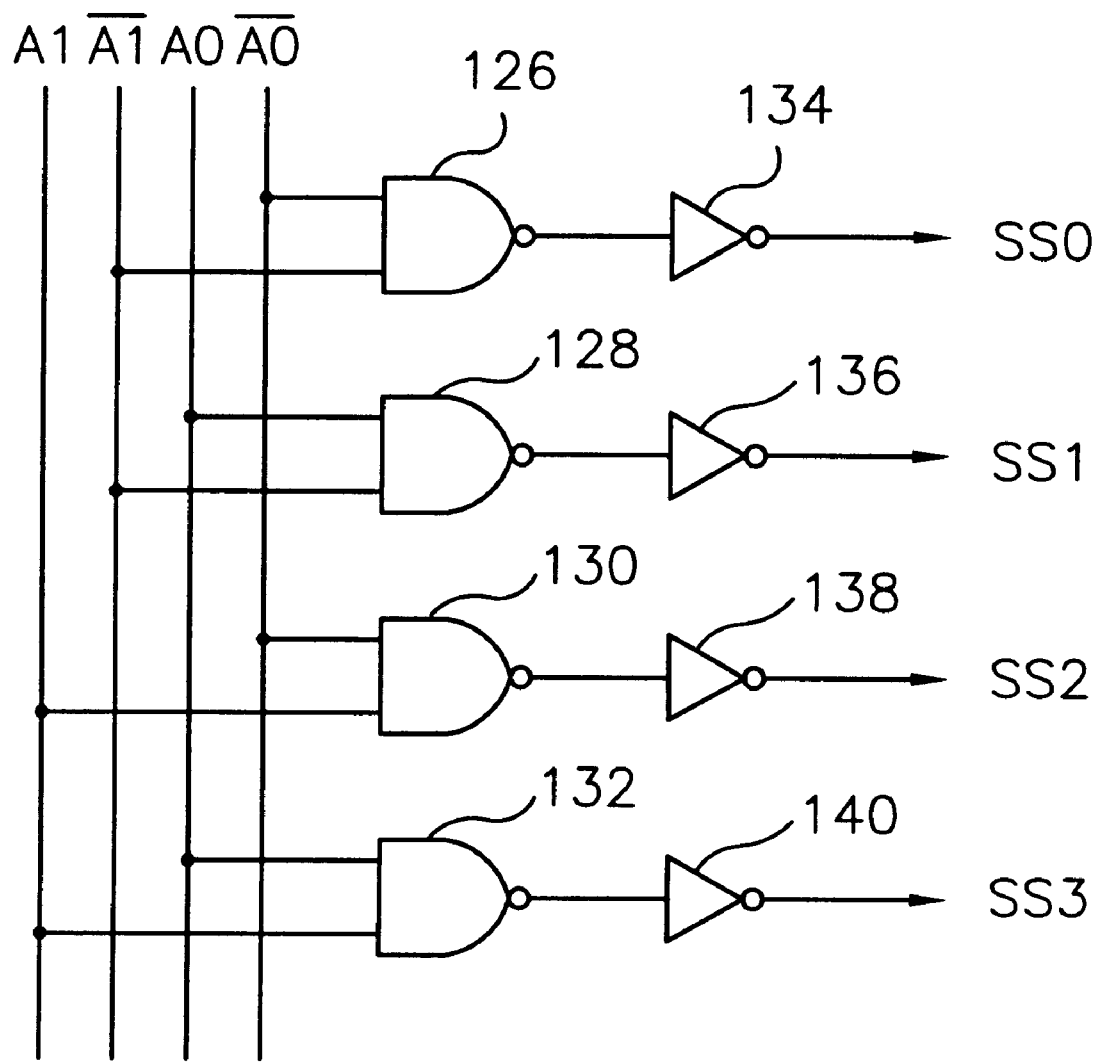
FIG. 3 is a circuit diagram of the page decoder shown in FIG. 1.
Figure 4:
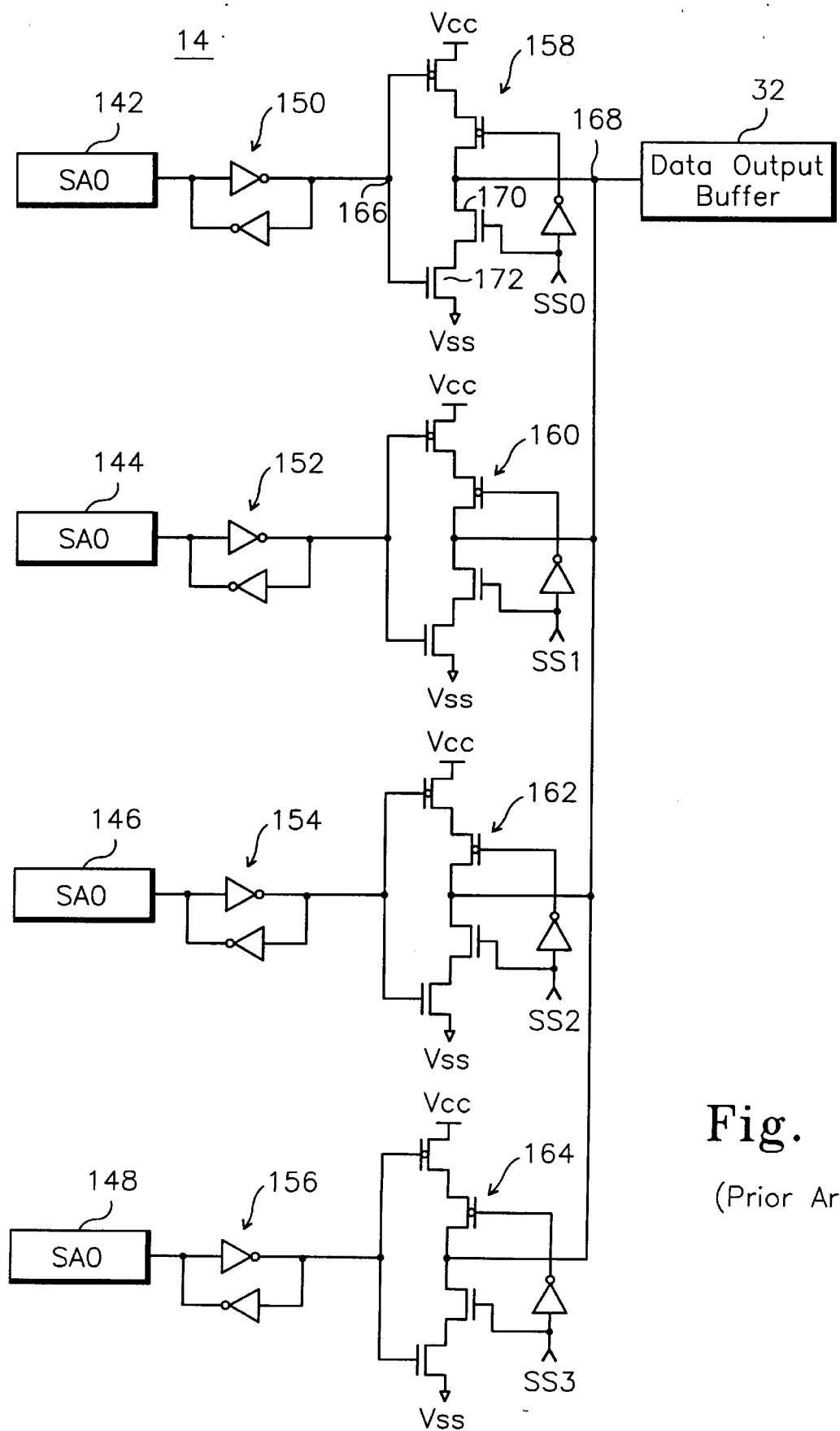
FIG. 4 is a circuit diagram of the sense amplifier shown in FIG. 1.
Figure 5:
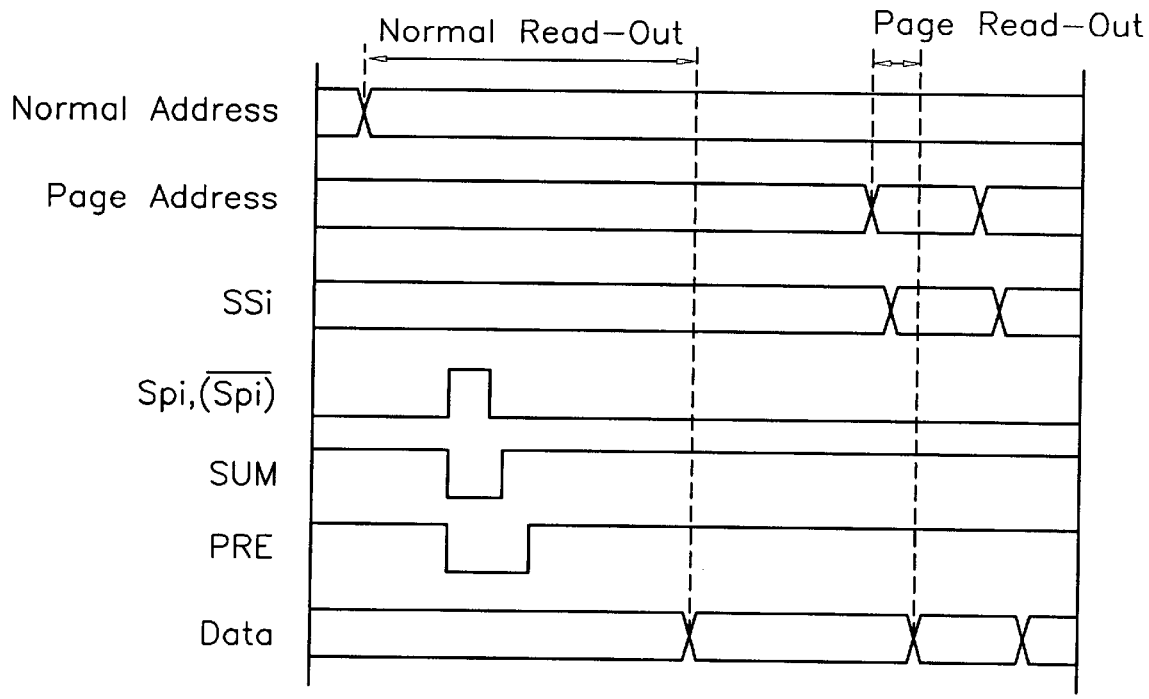
FIG. 5 is a timing diagram illustrating a timing flow when a normal read operation is conducted in the semiconductor memory of FIG. 1.
Figure 6:
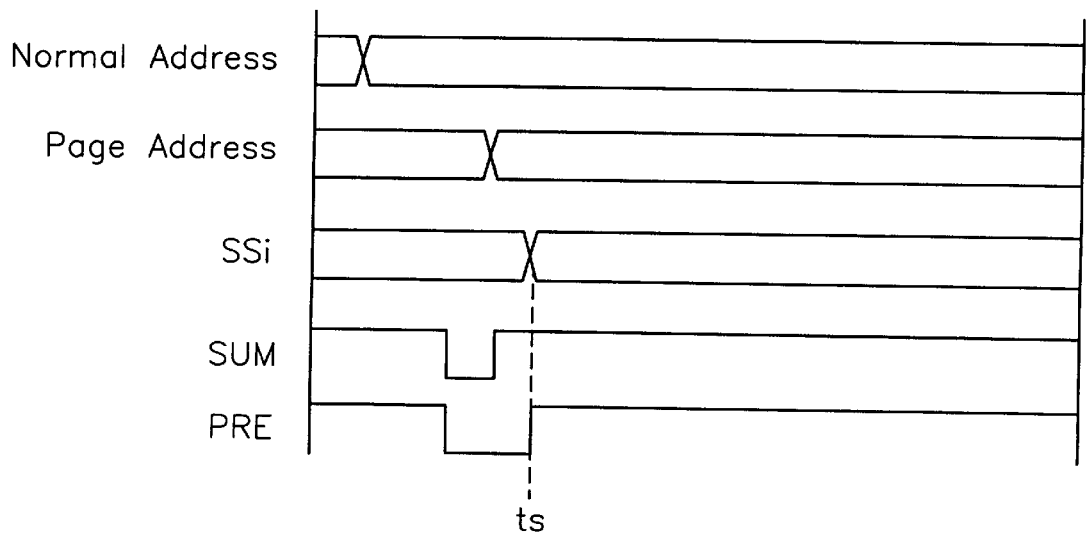
FIG. 6 is a timing diagram illustrating a timing flow when an abnormal read operation occurs in the semiconductor memory of FIG. 1.
Figure 8:
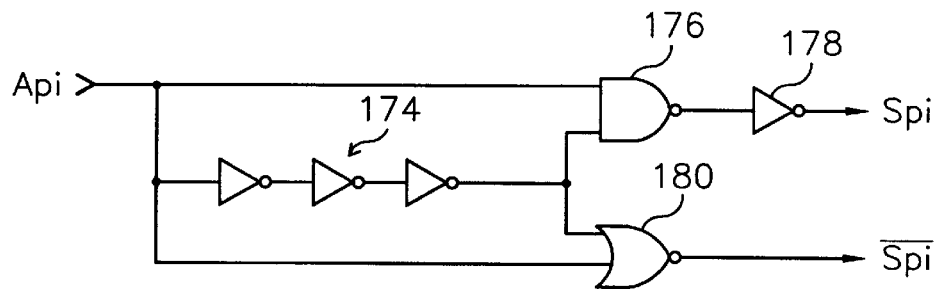
FIG. 8 is a circuit diagram of the short pulse generators of FIG. 7.
Figure 9:
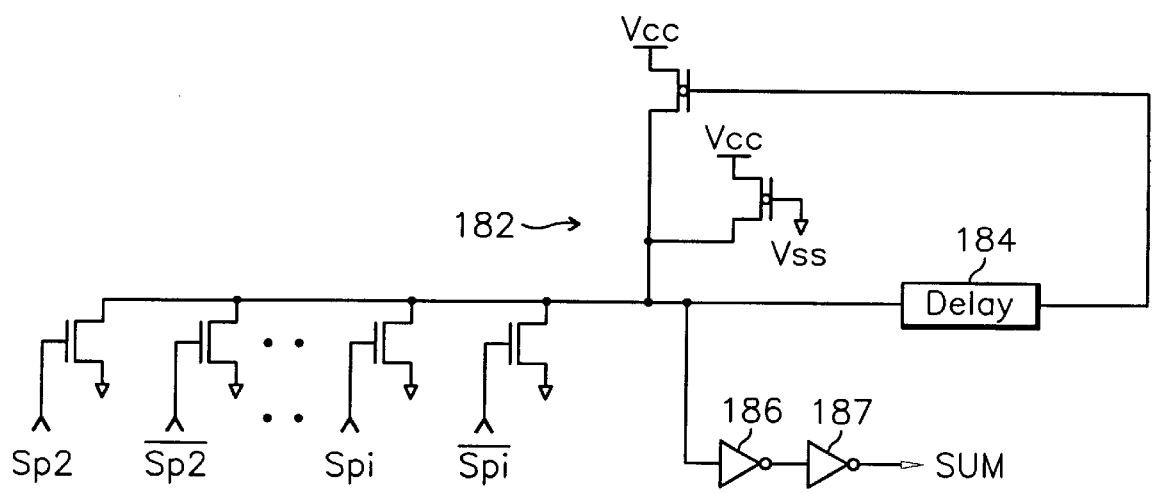
FIG. 9 is a circuit diagram of the summing amplifier (or summator) of FIG. 7.
Figure 10:
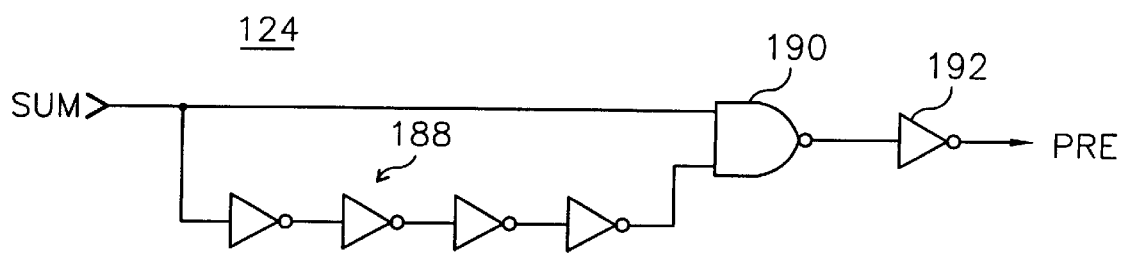
FIG. 10 is a circuit diagram of the precharge decoder of FIG. 7.

The page address signals are in turn controlled by the page decoder control pulse PCSS. The sense amplifier circuitry 14 receives the page decoding signals $SS_i$ from the page decoder 28a only when the page decoder control pulse PCSS permits page address signals to become effective. The address transition detector 30 comprises short pulse generators 116 to 120, a summing amplifier (or summator) 122, and a precharge controller 124. The precharge controller 124 directly outputs the precharge control pulse. The precharge control pulse PRE is one of outputs provided by the address transition detector 30 for the purpose of various control function within the semiconductor memory. The sense amplifier circuitry 14 may include a plurality of sense amplifiers connected to data lines from a column pass circuit 12, a plurality of data latches, and transmission circuits. The precharge control pulse PRE controls the activation of the sense amplifiers in the circuitry 14. The practical circuit configurations about the address transition detector 30 and the sense amplifier 14 are similar to those described above with reference to FIGS. 2 through 4. In the preferred embodiment, FIG. 8 is a circuit diagram of the short pulse generators of FIG. 7, FIG. 9 is a circuit diagram of the summing amplifier (or summator) of FIG. 7, and FIG. 10 is a circuit diagram of the precharge decoder of FIG. 7.

The data output buffer 32 receives page-decoded data bit from the sense amplifier circuitry 14 (more particularly, from the transmission circuit in the circuitry) and provides it to input/output pads 34 under the control of precharge control pulse PRE and the output enable signal 20.

Figure 11:
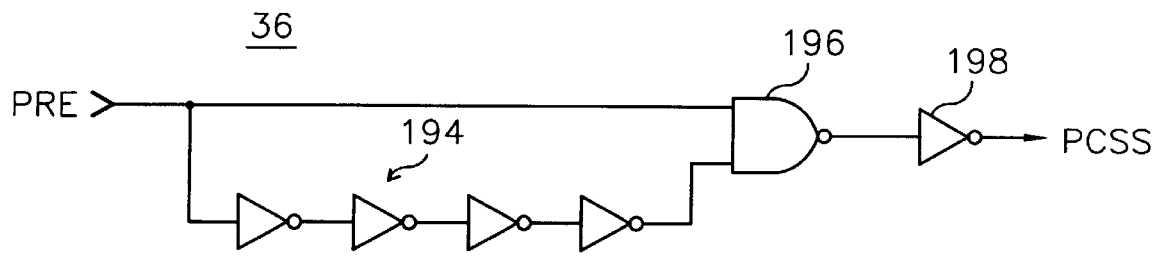
FIG. 11 is a circuit diagram of the decoder control circuit of FIG. 7.

FIG. 11 is a circuit diagram of the decoder control circuit of FIG. 7. As shown in FIG. 11, the page decoder control circuit 36 determines the page decoder control pulse PCSS by means of a pulse generating circuit formed of a NAND gate 196 and delay chain 194 of inverters. One input terminal of the NAND gate 196 is directly connected to precharge control pulse PRE and, to the other input terminal of NAND gate 196, PRE is coupled through delay chain 194. An output of the NAND gate 196 becomes the page decoder control pulse PCSS after passing through an inverter 198 having a pulse width longer than that of the precharge control pulse PRE.

Figure 12:
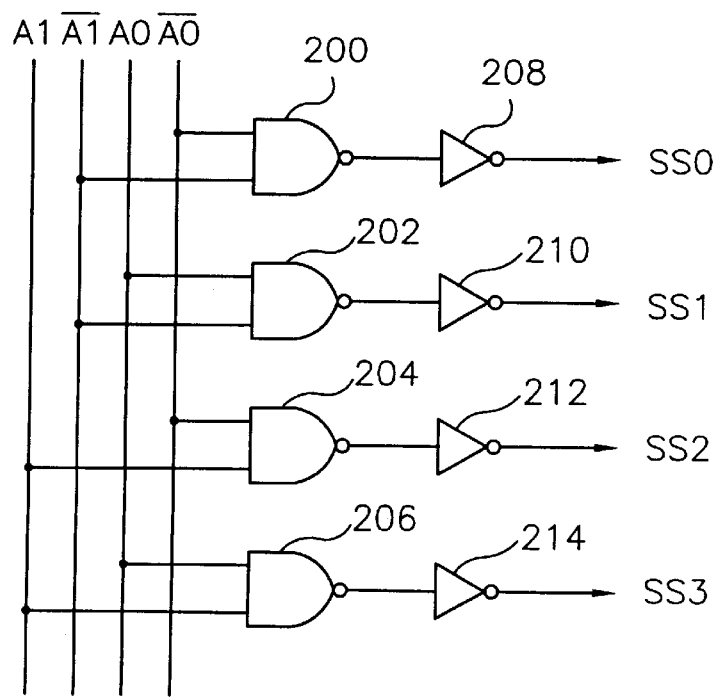
FIG. 12 is a circuit diagram of the page decoder of FIG. 7.

FIG. 12 is a circuit diagram of the page decoder of FIG. 7. As shown in FIG. 12, all of the NAND gates 200 through 206 of page decoder 28a receive the control signal PCSS in common, in order to determine a permission of gating with the page address signals $A_0$ and $A_1$ (including their complementary signals $\overline{A^0}$ and $\overline{A^1}$). The outputs of the NAND gates 200 through 206 are become the page decoding signals $SS_0$ to $SS_3$ after passing through inverters 208 to 214, respectively. The outputs of the NAND gates 200 through 206 are held at a high level when the page decoder control pulse PCSS is at a low level. This forces the page decoding signals into disable states.

Figure 13:
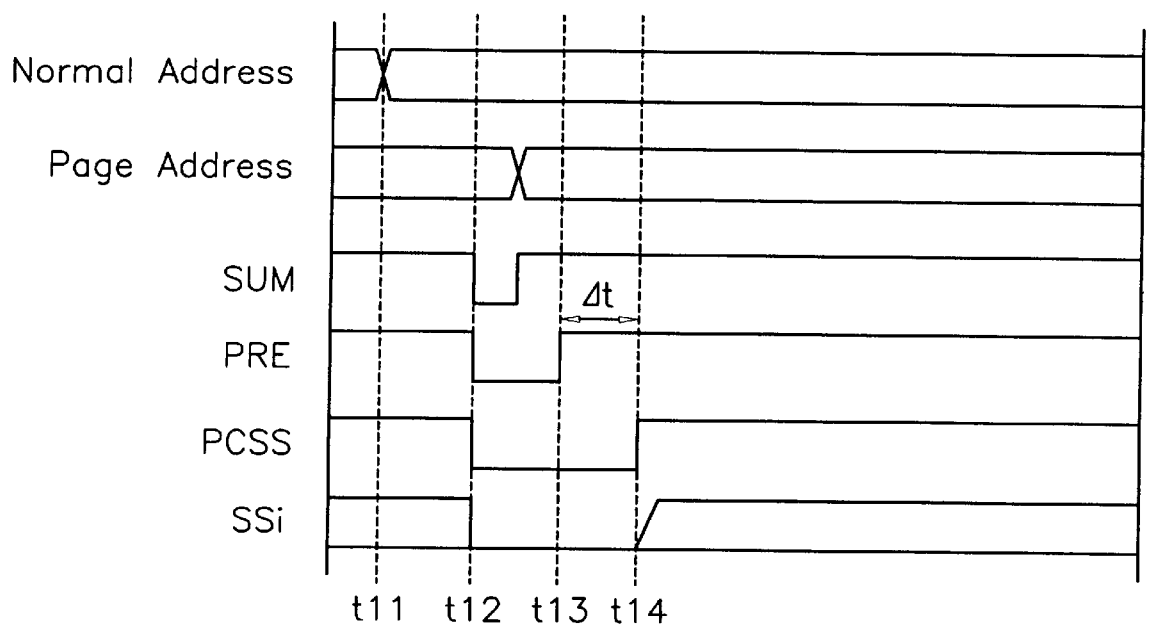
FIG. 13 is a timing diagram for a read operation in the memory of FIG. 7, according to a preferred embodiment of the present invention.

FIG. 13 is a timing diagram for a read operation in the memory of FIG. 7, according to a preferred embodiment of the present invention. The operating characteristic of the preferred embodiment described with reference to FIG. 7 is described below with reference to FIG. 13. The timing diagram of FIG. 13 illustrates the sequential timing of the page decoding operation for sensing stability. It should be appreciated that, after a normal address is changed to a valid state at $t_{11}$, a precharge control pulse PRE of low level is generated from address transition detector 30 at $t_{12}$ in response to the sum pulse SUM. The precharge control pulse PRE has a pulse width longer than that of the sum pulse SUM. Once the precharge control pulse PRE has been activated, page decoder control pulse PCSS becomes low. The page decoder control pulse PCSS has a pulse width longer than that of the precharge control pulse PRE by Δt. The precharge control pulse PRE goes to a high level at $t_{13}$ and the page decoder control pulse PCSS goes to a high level at $t_{14}$ equal to $(t_{13}+\Delta t)$. The lapsing time of the low-level page decoder control pulse PCSS, from $t_{12}$ to $t_{14}$ is to secure a valid sensing operation by the sense amplifiers because the low-leveled PCSS causes page decoding signals $SS_0$ to $SS_3$ to be held at low levels as disable states. The low level page decoding signals cut off the conductivity of the transmission circuits of the sense amplifier circuitry 14. Thus, during the time between $t_{12}$ and $t_{14}$, sensed data bits stay in the data latches interposed between the sense amplifiers and transmission circuits in the circuitry 14. Then, after $t_{14}$ the sensed data bits are subsequently transferred in turn to the data output buffer 32 through their corresponding transmission circuit in response to alternatively activated page decoding signals $SS_0$ to $SS_3$.

As described above, the page read-out operation according to a referred embodiment of the invention is performed sufficiently and stably even when propagation skew occurs between the normal address and the page address.

Although only one embodiment of the invention has been disclosed and described, it will be appreciable that other embodiments and modification of the invention are possible. For example, the address transition detector generates other control signals besides the precharge control pulse PRE. It may be possible to provide the page decoder control pulse PCSS with use of the control signals, generated from the address transition detector, affected by the transition of the normal address. Moreover, the invention may be practical to most semiconductor memory devices that use address transition detecting and page read-out functions, such as non-volatile memory.

What is claimed is:

1. A semiconductor memory having a read function that generates a plurality of data bits to a single output pin, the memory comprising:

a memory array for storing the plurality of data bits;

an address transition detector for generating a precharge control pulse responding to a transition of a first address;

a control circuit for generating a decoder control pulse in response to the precharge control pulse;

a sense amplifier circuit for reading some of the plurality of data bits from the memory array, the sense amplifier circuit comprising data latches and transmission circuits, and being coupled to an output pin through a data output buffer; and a decoder for receiving a second address and for providing decoding signals to the sense amplifier circuit in response to the decoder control pulse.

2. A semiconductor memory as recited in claim 1, wherein the number of the sense amplifiers, the data latches, and transmission circuits in the sense amplifier circuit is equal to the number of data bits.

3. A semiconductor memory as recited in claim 1, wherein the number of decoding signals provided by the decoder is being equal to the number of data bits.

* * * * *